(12) United States Patent
Chung

(10) Patent No.: US 11,081,285 B2
(45) Date of Patent: Aug. 3, 2021

(54) ELECTRICALLY CONDUCTIVE ELECTRET AND ASSOCIATED ELECTRET-BASED POWER SOURCE AND SELF-POWERED STRUCTURE

(71) Applicant: Deborah Duen Ling Chung, East Amherst, NY (US)

(72) Inventor: Deborah Duen Ling Chung, East Amherst, NY (US)

(73) Assignee: Deborah Duen Ling Chung, East Amherst, NY (US)

( * ) Notice: Subject to any disclaimer, the term of this patent is extended or adjusted under 35 U.S.C. 154(b) by 0 days.

(21) Appl. No.: 16/406,998

(22) Filed: May 8, 2019

(65) Prior Publication Data
US 2021/0012969 A1    Jan. 14, 2021

(51) Int. Cl.
*H01G 7/02* (2006.01)
*H02N 1/00* (2006.01)
*H01L 29/24* (2006.01)

(52) U.S. Cl.
CPC .............. *H01G 7/02* (2013.01); *H02N 1/00* (2013.01); *H01L 29/24* (2013.01)

(58) Field of Classification Search
CPC . H01G 7/02; H01G 7/023; H02N 1/00; H01L 2924/00
See application file for complete search history.

(56) References Cited

U.S. PATENT DOCUMENTS

| 3,924,324 | A | * | 12/1975 | Kodera | .................. H01G 7/02 29/592.1 |
| 7,449,811 | B2 | | 11/2008 | Suzuki | |
| 7,855,017 | B1 | | 12/2010 | Snyder | |

(Continued)

OTHER PUBLICATIONS

Reimund Gerhard, A Matter Of Attraction: Electric Charges Localised On Dielectric Polymers Enable Electromechanical Transduction, Sep. 14, 2014, Institute of Physics and Astronomy, 2014 Annual Report Conference on Electrical Insulation and Dielectrics Phenomena, pp. 1-10 (Year: 2014).*

*Primary Examiner* — Michael C Zarroli

(57) ABSTRACT

This invention provides electrically conductive electret, electret-based direct-current power source and structural electret, with applications including the self-sensing of damage, stress and strain (including structural self-sensing) and electric powering (including structural self-powering). The electret is an electrically conductive material comprising mobile charge carriers (electrons, holes or ions), which exhibit a gradient in the carrier concertation along a line connecting the positive charge center and negative charge center in the electret. The carriers create an electric dipole. The material is electrically continuous along this line, which is along the path of least electrical resistance. The material exhibits microstructure comprising microscopic features that are positioned along said line and that interact with said carriers, with the interaction enhancing said dipole. The materials are preferably metals, carbons and their composites. The electret's electric field preferably ranges from 10' V/m to 1 V/m. The electrical conductivity preferably ranges from $10^3 \Omega^{-1} \cdot m^{-1}$ to $10^8 \Omega^{-1} \cdot m^{-1}$.

20 Claims, 10 Drawing Sheets

(56) References Cited

U.S. PATENT DOCUMENTS

| | | | |
|---|---|---|---|
| 8,076,825 B1 | 12/2011 | Kaajakari | |
| 9,362,849 B2 | 6/2016 | Okada | |
| 9,413,272 B2 | 8/2016 | Aoyagi | |
| 9,455,647 B2 | 9/2016 | Takeuchi | |
| 9,736,594 B2 | 8/2017 | Khenkin | |
| 9,902,818 B2* | 2/2018 | DeSimone | C08J 5/00 |
| 2007/0227359 A1 | 10/2007 | Choi | |
| 2007/0235903 A1 | 10/2007 | Chin | |
| 2009/0017295 A1 | 1/2009 | Liu | |
| 2009/0056548 A1 | 3/2009 | Woo | |
| 2011/0062820 A1 | 3/2011 | Aoyagi | |
| 2011/0095626 A1 | 4/2011 | Shih | |
| 2011/0186437 A1 | 8/2011 | Huang | |
| 2012/0097035 A1 | 4/2012 | Chapman | |
| 2012/0153772 A1* | 6/2012 | Landa | H02N 11/002 |
| | | | 310/309 |
| 2014/0334646 A1 | 11/2014 | Naylor | |
| 2015/0107457 A1 | 4/2015 | Huang | |
| 2015/0246362 A1 | 9/2015 | Quincy, III | |
| 2015/0301105 A1 | 10/2015 | Lamesch | |
| 2016/0102223 A1 | 4/2016 | Kim | |
| 2016/0204716 A1 | 7/2016 | Suzuki | |
| 2016/0285391 A1 | 9/2016 | Asanuma | |
| 2017/0092652 A1 | 3/2017 | Cheung | |
| 2017/0133952 A1 | 5/2017 | Matsumoto | |
| 2017/0312504 A1 | 11/2017 | Fishman | |
| 2018/0048247 A1 | 2/2018 | Gerstenberger | |
| 2018/0236385 A1 | 8/2018 | Jinka | |
| 2018/0236389 A1 | 8/2018 | Sudheer | |
| 2018/0243674 A1 | 8/2018 | Gulrez | |

\* cited by examiner

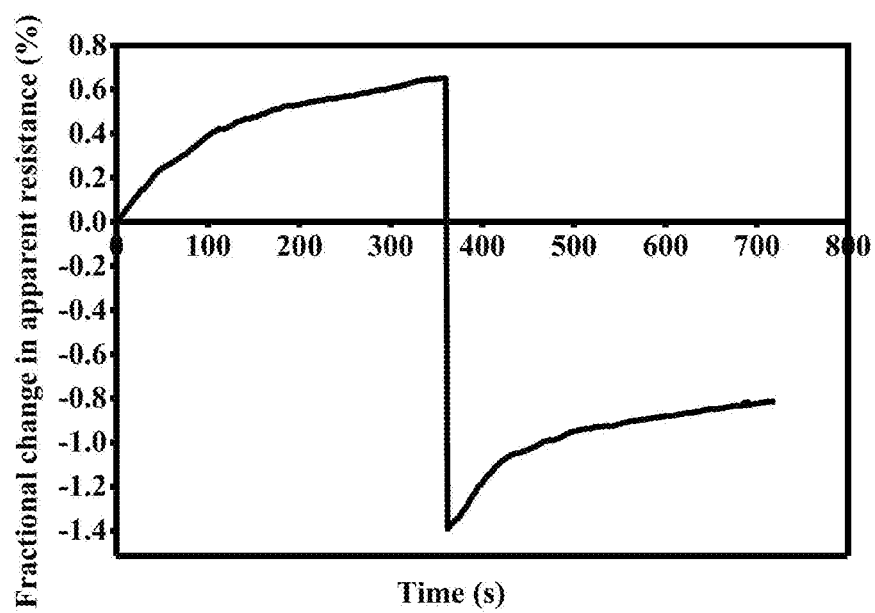
Figure 9A (i.e., Figure 9(a))

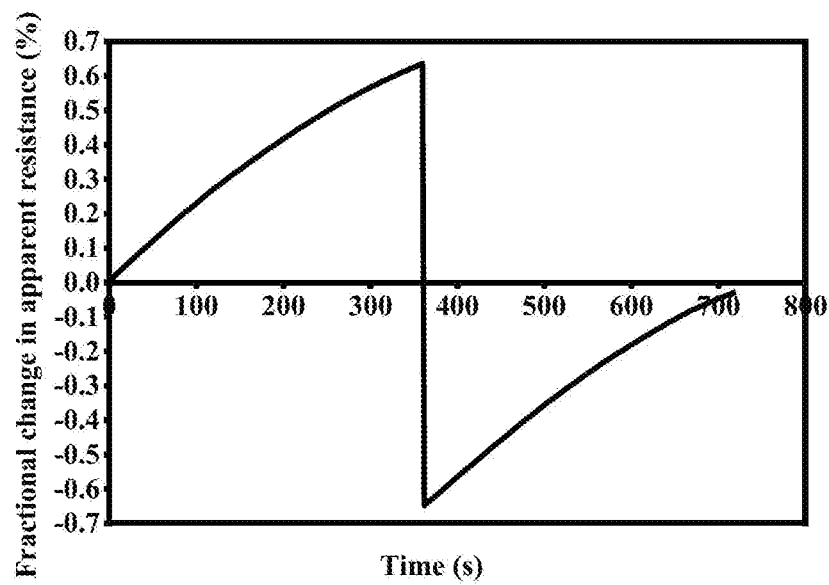
Figure 9B (i.e., Figure 9(b))

ELECTRICALLY CONDUCTIVE ELECTRET AND ASSOCIATED ELECTRET-BASED POWER SOURCE AND SELF-POWERED STRUCTURE

FIELD OF THE INVENTION

The present disclosure relates to the field of electrets.

BACKGROUND OF THE INVENTION

Electric power sources include solar, nuclear, hydroelectric, wind, natural gas, coal, biomass and petroleum. In spite of the large variety of existing power sources, energy remains a significant issue all over the world. Examples of issues include the greenhouse gas emission associated with the burning of fossil fuels, the oil spills associated with offshore oil wells, the fires due to oil/gas leakage from oil/gas pipelines, the environmental pollution associated with the disposal of batteries and supercapacitors, the fire hazard of some batteries and supercapacitors, the inadequate public safety of nuclear reactors, the high cost of photovoltaics (solar cells) in the absence of government subsidies, the cost (and sometimes difficulty and inadequate safety) of transporting the energy from the place of generation of the particular form of energy to the place of energy usage (with the difficulty stemming from the required energy transportation infrastructure, such as pipelines), etc.

An electric dipole is a pair of positive charge and negative charge that are equal in magnitude but are separate from one another by a distance. The electric dipole moment (a measure of the polarity) is defined as the product of the magnitude of the charge and the distance of separation of the positive and negative charges. The direction of the electric dipole moment is along the line connecting the positive charge and negative charge, and is from the negative charge to the positive charge. For a given distance between the positive charge and negative charge, an electric dipole is enhanced (strengthened) when the magnitude of charge is increased, or when the electric dipole moment becomes more stable (more permanent).

An electric dipole is associated with an electric field, which is directed between the positive charge and negative charge. The electric field is equal to the negative of the voltage gradient. Hence, it is in the direction from the point of higher voltage to the point of lower voltage. The magnitude of the electric field is equal to the magnitude of the voltage gradient.

An electret is defined as a permanent (or quasi-permanent) electric dipole. It can reside in a material, which houses both the positive charge and negative charge that are associated with the electret.

In the prior art, electrets in the form materials (i.e., electric dipoles housed in materials) involve materials that are essentially nonconductive electrically. They are predominantly in the form of electrically nonconductive polymers (US 20180236389; US 20160102223; US 20150107457; US 20120097035; US 20110186437; US 20090017295; US 20070235903; US 20110095626) that have been poled, i.e., subjected to a high electric field. The poling is necessary in order for the material to exhibit an electric dipole (US 20090056548; U.S. Pat. No. 7,449,811). A particularly common method of poling involves corona discharge (US 20070227359; US 20120097035).

Poling suffers from the tendency to depole (i.e., weakening of the electric dipoles formed during prior poling) after poling (i.e., after the removal of the electric field used for the prior poling). In other words, the electret produced by the poling does not provide a truly permanent electric dipole. As a result of the depoling, repoling (i.e., repeated poling) is necessary. The need to repole greatly reduces the suitability for practical use.

The electric field provided by an electret is used in various applications. Dominant applications include the removal of dust particles (US 20090056548) and the filtration of air or gas (US 20150107457; US 20150246362; US 20180243674; US 20180236389; US 20180236385; US 20070227359). Less common applications include cardiovascular implants (US 20170312504) and data storage (US 20170092652).

Due to the essential electrical non-conductivity of the medium (or material) housing the electric dipole, an electret of the prior art acts as a capacitor rather than a conductor. It is well-known that direct-current (DC) electric current (i.e., a continuous flow of electric current in the same direction) cannot go through a capacitor. As a consequence, DC electric current cannot flow continuously through these electrets. Only a pulse of DC current can flow from the positive electrode (i.e., the electrode at the positive end of the electric dipole in the electret) to the negative electrode (i.e., the electrode at the negative end of the electric dipole in the electret) along the outer circuit that connects the two electrodes. As the current pulse flows, the magnitude of charge decreases. Therefore, the pulse would stop when the magnitude of charge becomes zero. A current pulse is less useful and less easy to detect than a continuous current.

On the other hand, an alternating-current (AC) electric current can flow through the abovementioned outer circuit if the magnitude of charge is varied with time. In other words, a change in the magnitude of charge gives rise to a current pulse and a continuously changing charge magnitude (i.e., the charge magnitude varying with time, such as variation in the form of a sinusoidal wave) causes a series of current pulses that occur essentially continuously (i.e., very close in the time of occurrence). The superposition of these pulses results in an AC (time-varying) electric current. For example, this AC current is in the form of a sinusoidal wave when the charge magnitude change is in the form of a sinusoidal wave.

In order to obtain a change in the charge magnitude, a stimulus is needed. For example, a sinusoidal change in the charge magnitude needs a sinusoidal change in the stimulus. An example of a stimulus is mechanical stress. With a change in the mechanical stress applied to the capacitor a direction parallel to the direction of the electric dipole, the charge magnitude is changed. For example, a sinusoidal change in the mechanical stress causes a sinusoidal change in the charge magnitude. Thus, a time-varying stimulus results in a time-varying electrical response (i.e., an AC current). As a result, the electret is able to sense the time-varying stress through the AC current output. This effect is known as the piezoelectret effect, which converts the mechanical energy input to an electrical energy output. However, without a time-varying charge magnitude (i.e., without a time-varying stimulus), the electret of the prior art (acting as a capacitor) is not able to provide an AC current, but merely a short DC current pulse, as explained above.

The direct piezoelectric effect is based on the effect of time-varying stress/strain on the electric polarization in the piezoelectric material, which is not an electret. This effect also converts mechanical energy to electrical energy. Due to their low conductivity or non-conductivity, piezoelectric materials act as capacitors, akin to the electrets of the prior art. Akin to the piezoelectret effect, the direct piezoelectric effect requires the input stimulus to be time varying. The time-varying stimulus results in a time-varying electrical response (i.e., an AC current). Without a time-varying stimulus, a piezoelectric material is not able to provide an AC current, but merely a short DC current pulse.

Due to their essential non-conductivity, the electrets of the prior art exhibit very high electrical resistance. As a result, these electrets essentially cannot provide electric power. This is because the power P is given by the equation $$P = V^2/R, \qquad (1)$$

where V is the voltage provided by the electric field and R is the resistance of the electret. When R is very large, P is very small.

In the absence of a time-varying stimulus, an electret involving a low-conductivity or nonconductive material cannot serve as an electrical power source (whether DC or AC). In the presence of a time-varying stimulus, this electret can function to convert the input mechanical energy to electrical energy, which is AC. The energy conversion function is to be distinguished from the function of directly providing electrical energy without the need for an input stimulus.

Sound is a pressure wave. By using time-varying stimulus in the form of stress or sound, the conversion of mechanical energy associated with the stress or sound to electrical energy has been shown for some of the electrets in the prior art. Applications include microphones (which pertain to sound) (U.S. Pat. No. 9,736,594; US 20140334646) and devices that convert mechanical energy to electrical energy (US 20170133952; US 20160285391; U.S. Pat. Nos. 9,455,647; 9,413,272; 9,362,849; US 20110062820; US 20150301105; US 20160204716). The energy conversion can be for the purpose of sensing the mechanical or sound input, harvesting the mechanical energy, or obtaining electrical energy. The output electric current is AC and not DC, though the AC current can be converted to a DC current by using an electronic device such as a rectifier (US 20180048247; U.S. Pat. No. 8,076,825). However, the electric power obtained is low, ranging typically from 1 to 100 µW.

It is desirable for a structural material to be multifunctional, so that it is able to serve as an electric power source. This capability allows the structure made of the structural material to be able to generate electric power for its own use, thus rendering the structure with the self-powering ability. This ability is particularly attractive for structures that are off the electrical grid, in addition for transportation vehicles (e.g., cars, trains, ships and aircraft), aerospace structures (e.g., satellites), and deep subsurface structures (e.g., geothermal wells and gas/oil wells).

In the prior art, structural materials that can serve as power sources are structural materials with embedded or attached electric power devices or electric power device components, e.g., a structural material with an embedded battery (U.S. Pat. No. 7,855,017; EP 3459842; WO 2014033276). The embedment or attachment of a device (e.g., a battery) or device components (e.g., the anode, cathode and electrolyte of a battery) suffers from (i) the inadequate durability of the device (with the device being capable of a service life that is short compared to the intended service life, perhaps decades, of the structure), (ii) the high cost of the device or device components, (iii) the toxicity of some of the device components, and (iv) the non-applicability of the technology to existing structures, which do not have such embedment or attachment. The non-applicability furthermore means that only new structures can benefit from the technology, thus greatly limiting the breadth of the application. In case of the embedment of a device or device components, additional disadvantages are the difficulty of repair and the loss in mechanical performance of the structure.

Structures may degrade during use, improper usage, weathering (by wind, rain, ocean waves, heat, low temperatures, temperature excursions, etc.), accidents (such as collisions), natural events (such as lightning, storms, hurricanes and earthquakes). Degradation (damage) sensing is important for both structural and functional materials. This is because the degradation (e.g., crack formation, void formation, mass loss, etc.) commonly occurs and affects not only the operation using the material, it can also cause hazards. Timely detection of the degradation is valuable for alleviating the hazard and reducing the negative impact on the operation.

Structures encounter stress and/or strain during use. During normal structural operation, the stress/strain is in the elastic (reversible) deformation regime. During accidents and some natural events, the stress/strain is beyond that in the elastic deformation regime, so that it is in the plastic (permanent) deformation regime. In order to facilitate the control of the structural operation, the detection of vibrations (usually undesirable), and the mitigation of hazards, the sensing of the stress/strain of a structure during use is needed.

Sensors are commonly used to sense degradation, as well as stress and strain. Examples of sensors are optical fibers, resistive strain gages, piezoresistive sensors, piezoelectric sensors, ultrasonic transducers, acoustic transducers, eddy current sensors, etc. The sensors should be able to function without destroying any part of the material being assessed. Since the material can constitute of a structure that is too large to be moved to a laboratory for testing, the sensors need to be able to function in the field where the structure is located.

Sensors are commonly embedded or attached to the material being assessed in terms of the degradation, stress or strain. The use of such sensors is associated with high cost, low durability, limited sensing volume and mechanical property loss.

Due to the abovementioned disadvantages of using embedded or attached sensors, the ability of a structural material to sense its own condition (degradation, stress or strain) is attractive. This is known as structural self-sensing. The rendering of piezoresistive or piezoelectric behavior to a structural material (without embedded or attached sensors) is an approach used to attain the structural self-sensing.

A piezoelectric sensor or a piezoelectric structural material requires an input mechanical stimulus in the form of dynamic (time-varying) stress/strain in order for the sensor to be able to sense. In contrast, a piezoresistive sensor or a piezoresistive structural material does not require such a stimulus.

A piezoelectric sensor or piezoelectric structural material requires the sensor material or structural material to exhibit a substantially high value of the piezoelectric coupling coefficient. A high value of this coefficient requires the material to be specially formulated in terms of the combination of its electric permittivity, electrical resistivity and elastic modulus. Due to the special formulation, the material is not a conventional material that is widely used. As a result, piezoelectricity-based structural self-sensing is only applicable to structures that have the particular material design and is not broadly applicable to structures in general.

A piezoresistive sensor or a piezoresistive structural material requires the sensor material or the structural material to exhibit electrical resistivity that is not too low and not too high. When the resistivity is too low, the resistance is small and the changes in resistance due to the stress/strain is even smaller. In the measurement of such small resistance changes, an adequate level of reliability is difficult to achieve in the absence of expensive high-performance electronics. On the other hand, when the resistivity is too high, the resistance is high. The measurement of a high resistance requires a high voltage, which can be practically infeasible or difficult. Therefore, the piezoresistive material should be intermediate in resistivity. This limits the range of materials that are effective for providing piezoresistivity-based sensing.

In order to attain a suitable resistivity level for piezoresistivity-based sensing, an electrically conductive filler is typically added to a host material that is essentially nonconductive. The highest sensitivity occurs when the conductive filler volume fraction is in the vicinity of the percolation threshold. This threshold refers to the conductive filler volume fraction above which the filler units (whether particles or fibers) touch one another, thereby forming a continuous conductive path. The presence of a continuous conductive path greatly decreases the resistivity of the composite material.

Due to the particular design of a piezoresistive material in terms of the conductive filler composition and conductive filler volume fraction, the material is not a conventional material that is widely used. As a result, piezoresistivity-based structural self-sensing is only applicable to structures that have the particular material design and is not broadly applicable to structures in general.

The loss in mechanical performance due to the presence of the embedded device or embedded device components is partly because the device or device component disrupts or weakens the structure. In case of the device being a battery, the loss in mechanical properties is also partly because the polymer matrix of the multifunctional structural composite not only serves to bind the reinforcing fibers together, but also serves as an electrolyte. An electrolyte is an ionic conductor, i.e., a conductor that conducts through the movement of ions. The electrolyte is a necessary part of a battery. A polymer matrix that is capable of serving as an electrolyte is mechanically inferior to one that is typically used for polymer-matrix structural composites. As a consequence, the mechanical properties of polymer-matrix structural composite materials that can render the battery function are inferior to those that serve only the structural function. Mechanical performance is critically important to structures. Compromising the mechanical performance for the sake of a non-structural function is not desirable.

The present invention is directed to overcoming these and other deficiencies in the art.

SUMMARY OF THE INVENTION

This invention provides an electret, said electret comprising an electric dipole, said dipole comprising a positive charge center and a negative charge center, said dipole exhibiting electric field, said electric field preferably ranging from $10^{-6}$ V/m to 1 V/m, and said dipole residing in an electrically conductive material.

The electret is in the form of electrically conductive material comprising mobile charge carriers, which exhibit a gradient in the carrier concertation along a line connecting the positive charge center and the negative charge center in the electret. The carriers create said dipole. The electrically conductive material is electrically continuous along this line, which is along the path of least electrical resistance. The electrical conductivity of the electrically conductive material preferably ranges from $10^3 \Omega^{-}\cdot m^{-1}$ to $10^8 \Omega^{-1}\cdot m^{-1}$. The electrically conductive material exhibits microstructure, which comprises a plurality of microscopic features. These features are positioned along the line. Moreover, these features interact with said carriers, said interaction enhancing said dipole.

This invention provides an electric power source, said source comprising an electret, said electret comprising an electrically conductive material. Due to the conductivity, the power source allows current to pass through it and provides DC power.

This invention provides a structural material comprising an electret, which comprises an electrically conductive material. The electret allows the structural material to serve as a power source and a sensor of degradation (damage) and stress/strain, which are indicated by the effects of degradation (damage) and stress/strain on the electric field (related to the voltage) or capacitance of the electret. Thus, the structural material is self-powering and self-sensing.

The electrically conductive materials are selected from the group consisting of metals, alloys, steel, stainless steel, nickel, copper, tin, tin-lead, metal-matrix composites, carbons, carbon fibers, graphite, graphene, carbon nanotubes, carbon nanofibers, isotropic graphite, exfoliated-graphite-based flexible graphite, carbon-carbon composites, polymer-matrix composite, carbon-matrix composite, ceramic-matrix composite and cement-matrix composite.

BRIEF DESCRIPTION OF THE DRAWINGS

FIG. 9 illustrates the electrical asymmetry in the absence of prior depolarization (FIG. 9(a)) and the electrical symmetry immediately after depolarization by short-circuiting the electret for 6 minutes (FIG. 9(b)). The material is low carbon steel. A constant DC electric current of 1 mA is applied, causing the measured resistance (the apparent resistance) to increase beyond the true resistance, so that the fractional change in apparent resistance relative to the true resistance is positive. Upon sudden reversal of the current direction, the apparent resistance suddenly decreases to a value below the true resistance, so that the fractional change in the apparent resistance relative to the true resistance is negative. The degree of electrical symmetry is indicated by the degree of symmetry of the curve immediately before and immediately after the current direction reversal.

DETAILED DESCRIPTION OF THE INVENTION

This invention provides an electret, said electret material comprising electrically conductive material, said electrically conductive material exhibiting substantial electrical conductivity, said electrically conductive material comprising mobile charge carriers, said carriers exhibiting concentration, said concentration exhibiting gradient, said gradient being along a line in said electrically conductive material, said electrically conductive material also comprising electric dipole, said dipole being created by said carriers, said dipole consisting of positive charge center and negative charge center, said line consisting of a trace from said positive charge center to said negative charge center, said trace being along the path of least electrical resistance, said electrically conductive material being electrically continuous along said trace, said electrically conductive material also comprising microstructure, said microstructure comprising a plurality of microscopic features, said plurality of microscopic features being positioned along said trace (FIG. 1), said plurality of microscopic features interacting with said carriers, said interaction enhancing said dipole.

Figure 1:
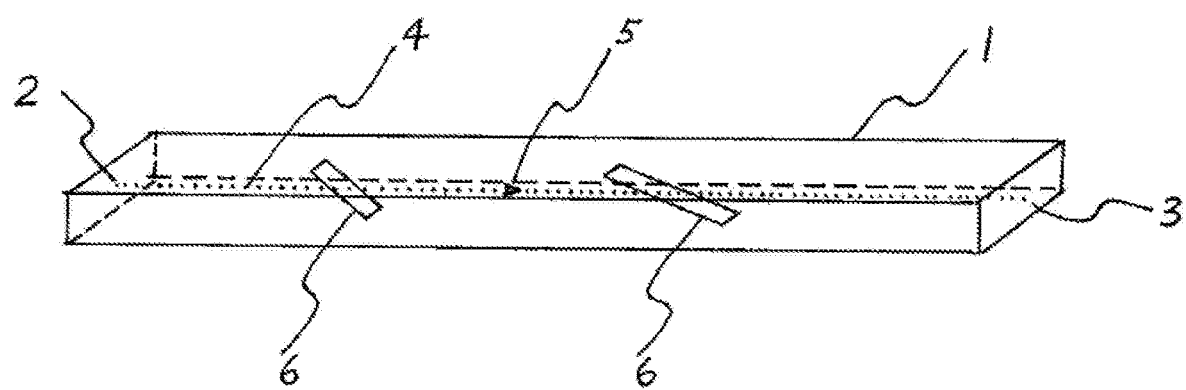
FIG. 1 is a schematic illustration of an example of an electret material of this invention. It comprises electrically conductive material 1, which is in the form of a bar. The bar comprises positive charge center 2, negative charge center 3, line 4 connecting 2 and 3, trace 5 (in the direction from 2 to 3), and a plurality of microscopic features 6. The features are at nonzero angles from the line.

The plurality of microscopic features is positioned along said trace. The features are not necessarily lined up in a single file along the trace. Rather, the features are distributed over the cross-sectional area of the conductive path. This path is described by the trace, which, for simplicity in the drawing, is drawn at the center line of the path (FIG. 1). The features are not necessarily only at the center line. In addition, the features in the plurality are not necessarily identical and the features are not necessarily equally spaced.

Said dipole is created by said carriers through the movement of said carriers. For example, the movement of electrons (negatively charged) causes the negative charge center to be near the destination of the movement and causes the positive charge center to be near the end away from the destination. Therefore, the mobility of the carriers is necessary.

An example of said interaction is a degree of affinity of the microscopic features with the carriers (e.g., electrons). The affinity enhances the stability (permanency) of the electric dipole. Stability of the dipole is important for an electret. However, the affinity should not be so excessive that the carriers are trapped by the microscopic features.

Due to said gradient of the carrier concentration along said line, any segment of the line also has its positive charge center and its negative charge center, which are near the ends of the line segment. The positive charge center of the line segment is proximate to the positive charge center of the line. The negative charge center of the line segment is proximate to the negative charge center of the line. Thus, an electret occurs in the line segment.

Figure 4:
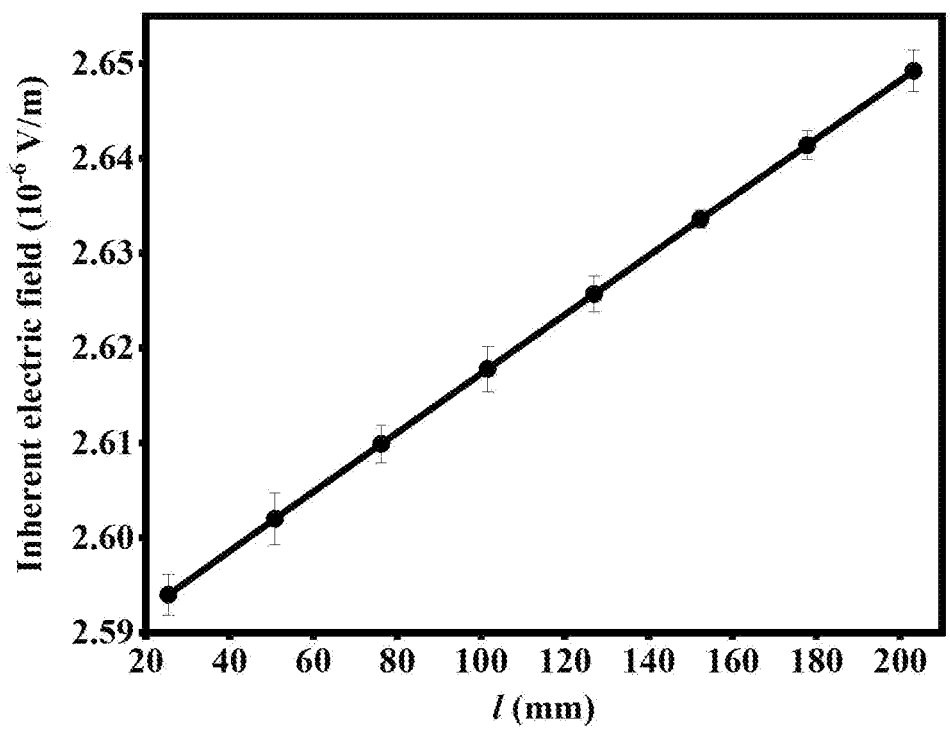
FIG. 4 illustrates the effect of the inter-electrode distance 1 up to 200 mm on the electric field for the case of copper (in the form of a bar cut from copper foil without cold work) as the electrically conductive material. The electric field increases monotonically and linearly with increasing 1.
Figure 7:
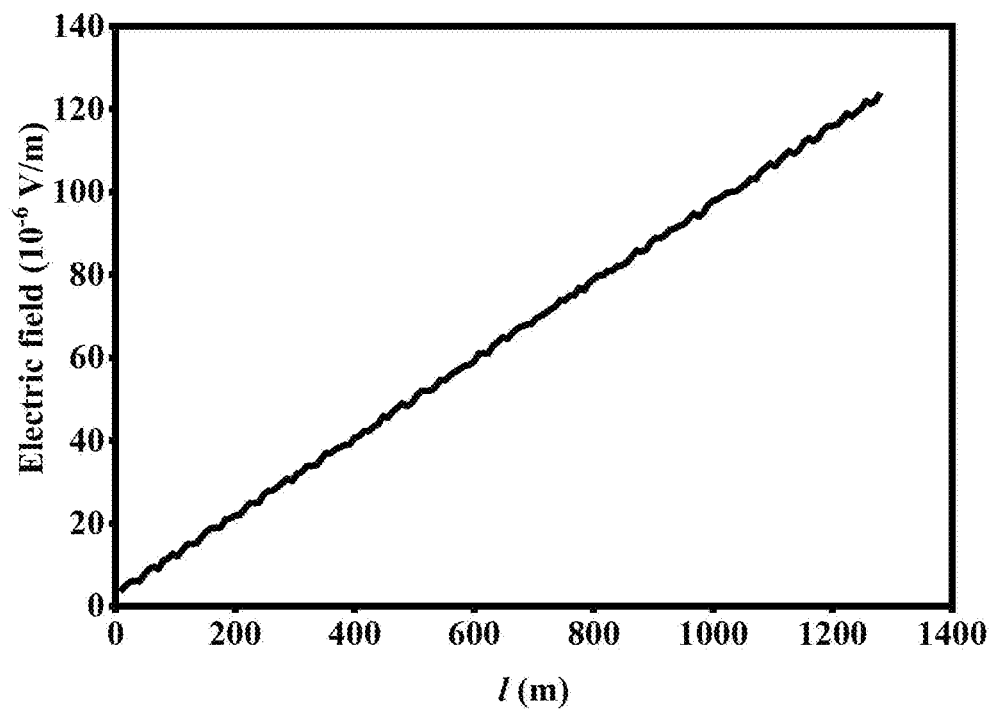
FIG. 7 illustrates the effect of the inter-electrode distance 1 up to 1280 m (m=meters) on the electric field for the case of copper (copper wire without cold work) as the electrically conductive material. The electric field increases linearly with 1. The electric field is $3.62 \times 10^{-6}$ V/m for the smallest l of 8 m and is $1.24 \times 10^{-4}$ V/m for the largest 1 of 1280 m.

In practice, the line segment is the part of the line between the two electrodes attached to the line. In other words, the line segment is delineated by the two electrodes and is chosen by the placement of the two electrodes. The length of a line segment can be varied, as governed by the inter-electrode distance. The electric field of the electret increases linearly with the inter-electrode distance (FIGS. 4 and 7). Therefore, a large value of the inter-electrode distance is preferred.

The electric dipole in the electret material of this invention exhibits electric field, said electric field preferably ranging from $10^{-6}$ V/m to 1 V/m. The dipole does not require poling for its formation.

The electrical conductivity of the electrically conductive material in the electret material of this invention preferably ranges from $10^3 \Omega^{-1} \cdot m^{-1}$ to $10^8 \Omega^{-1} \cdot m^{-1}$.

The electrically conductive material in the electret material of this invention is preferably selected from the group consisting of metals, alloys, copper, nickel, steel, stainless steel, alloy steels, galvanized steel, tin, tin-lead, metal-matrix composites, carbons, carbon fibers, exfoliated-graphite-based flexible graphite, carbon nanotubes, carbon nanofibers, graphite, graphene, isotropic graphite, carbon-carbon composites, ceramic-matrix composites, cement-matrix composites, polymer-matrix composites, and carbon-matrix composites.

The microstructure refers to the structure of a solid as viewed under a microscope. For example, the microstructure is in the scale of micrometers ($10^{-6}$ meter). The microstructure of the electrically conductive material of this invention comprises a plurality of microscopic features.

In general, the microstructure of a material can be symmetrical or asymmetrical along a line, relative to the mid-point of the line. Symmetry (i.e., microstructural symmetry) means that the microscopic features in the two parts are mirror images of one another, with the "mirror" that produces the mirror images being located at the mid-point of the line. This is akin to the two faces of a person being ideally symmetrical. In contrast, asymmetry (i.e., microstructural asymmetry) means that the microscopic features in the two parts are not mirror images of one another.

The microstructure of the electrically conductive material of this invention preferably exhibits microstructural asymmetry along the trace, with the asymmetry being relative to the mid-point of the trace. The mid-point of the trace refers to the point on the trace, such that the lengths of the two parts of the trace on the two sides of this point are the same in length.

The electrical characteristics of a material describe the electrical behavior of the material. Examples of electrical characteristics include (i) the electrical resistivity, (ii) the electric permittivity, (iii) the effect of frequency on the electrical resistivity, (iv) the effect of frequency on the electric permittivity, (v) the effect of temperature on the electrical resistivity, (vi) the effect of temperature on the electric permittivity, (vii) the relationship between the voltage (which relates to the electric field, which is the voltage divided by the length) and current, and (viii) the relationship between the voltage (which relates to the apparent resistance, which is the voltage divided by the current) and time during polarization at a constant current, etc.

In the absence of an electret in the material, the material is symmetrical electrically, so that the electrical characteristics are the same in the two opposite directions along which the electrical characteristics are measured. However, in the presence of an electret in the material, the material is asymmetrical electrically, so that one or more of the electrical characteristics are different in the two opposite directions that are along the line connecting the positive charge center and the negative charge center. In particular, in the presence of an electret in the material, the relationship between the voltage (which relates to the apparent resistance) and time during polarization at a constant current is different in the two opposite directions (FIG. 9).

The electrical characteristics of a material are affected by the microstructure of the material. For example, the microscopic features in the microstructure may affect the carrier movement. Microstructural asymmetry can result in electrical asymmetry.

The plurality of microscopic features in the electrically conductive material that is in the electret material of this invention preferably exhibits orientations. Moreover, said electrically conductive material exhibits a plurality of electrical characteristics. Said orientations comprise a plurality of orientations A, said plurality of orientations A being at a plurality of non-zero angles relative to said trace. Said plurality of orientations A results in microstructural asymmetry along said trace, said asymmetry being relative to the mid-point of said trace. Said plurality of electrical characteristics comprises electrical characteristic B. Said asymmetry results in substantial difference in said electrical characteristic B in the two opposite directions of said trace. Said difference enhances said dipole.

A solid material can comprise a crystalline portion. The portion exhibits crystallinity, which means that the constituents (atoms, ions and/or molecules) are arranged in a periodic pattern. The ions include cations and anions. The periodic pattern is known as the crystal structure. A basic repetitive unit of the crystal structure is known as the unit cell, which can have various shapes, such as the cubic shape. The directions in the crystal structure with respect to the edges of the unit cell (or with respect to another line that connects two different points in the unit cell) are known as crystallographic directions.

The crystalline portion of a solid is typically polycrystalline, i.e., comprising a plurality of crystallites (also known as grains). This is to be distinguished from a solid that is a single crystal. Engineering materials are typically polycrystalline rather than being single crystals. The different grains in the polycrystalline portion are typically oriented differently, so that a particular crystallographic direction (e.g., an edge of the unit cell) is in different physical directions for different grains.

The electrically conductive material preferably comprises a plurality of grains, said plurality of grains having crystallographic directions, said directions comprising crystallographic direction C, said crystallographic direction C being substantially parallel to said trace.

The mobile charge carriers in the electrically conductive material that is in the electret material of this invention are selected from the group consisting of electrons, holes (unoccupied electron sites or unoccupied electron states) and ions. The ions include cations and anions. Electrons and holes are more mobile than the ions, because ions are large compared to electrons or holes. As a consequence, electrons and holes are more effective than ions for creating an electric dipole through their movement. Electrons are typically the dominant carriers in metals. In case of carbon materials, the dominant carriers can include both electrons and holes.

The electrically conductive material that is in the electret material of this invention exhibits capacitance, which is proportional to the electric permittivity of this material. Thus, the electret can be characterized not only in terms of the voltage (which relates to the electric field), but also the capacitance (which relates to the permittivity). The capacitance is preferably obtained at frequencies ranging from 1 Hz to 1 MHz (1 MHz=$10^6$ Hz). The capacitance is most preferably obtained at frequencies ranging from 0.1 kHz to 10 kHz (1 kHz=$10^3$ Hz).

The electret material of this invention is affected by the applied stress/strain, so that both the voltage and capacitance of the electret material are affected by the stress/strain. Therefore, by measuring either the voltage or capacitance, the stress/strain can be obtained. In other words, the voltage or capacitance serves to indicate the stress/strain, thus allowing the electret to serve as a stress/strain sensor. The stress/strain does not need to vary with time in order to result in an electrical response from the electret. This is in contrast to the piezoelectret behavior of an electret of the prior art, which, due to the essential non-conductivity of the electret material, behaves as a capacitor, thus requiring the stress/strain to vary with time in order to result in an electrical response from the electret.

Due to the electrical conductivity of the electrically conductive material in the electret material of this invention, the capacitance needs to be measured using an LCR meter (i.e., an impedance meter) with the positioning of a dielectric film between the electrically conductive material and at least one of the two electrodes attached to the electrically conductive material. The electrodes are for the purpose of measuring the capacitance. The dielectric film is necessitated by the fact that an LCR meter (as commercially available) is not designed for measuring the capacitance of a material system with a low electrical resistance. The lower is the electrical resistance of the electret material, the thicker should be the dielectric film. An example of a dielectric film is a conventional double-sided adhesive tape. Multiple layers of the tape can be stacked in order to provide different thicknesses of the dielectric film.

The microscopic features in the electrically conductive material that is in the electret material of this invention are preferably selected from the group consisting of crystallographic planes, crystallographic directions, grain boundaries, crystallite boundaries, phase boundaries, interfaces, crystal lattice distortions, grain distortions, defects, dislocations, disclinations, twins, twinning faults, stacking faults, vacancies, Schottky defects, Frenkel defects, impurities, precipitates, pores, voids, channels and cracks.

This invention provides an electric power source, said source comprising an electret material, said electret material comprising electrically conductive material, said electrically conductive material exhibiting substantial electrical conductivity, said electrically conductive material comprising mobile charge carriers, said carriers exhibiting concentration, said concentration exhibiting gradient, said gradient being along a line in said electrically conductive material, said electrically conductive material also comprising electric dipole, said dipole being created by said carriers, said dipole consisting of positive charge center and negative charge center, said line consisting of a trace from said positive charge center to said negative charge center, said trace being along the path of least electrical resistance, said electrically conductive material being electrically continuous along said trace, said electrically conductive material also comprising microstructure, said microstructure comprising a plurality of microscopic features, said plurality of microscopic features being positioned along said trace (FIG. 1), said plurality of microscopic features interacting with said carriers, said interaction enhancing said dipole.

The plurality of microscopic features in the electrically conductive material that is in the electret material in the power source of this invention preferably exhibits orientations, and said electrically conductive material exhibits a plurality of electrical characteristics, said orientations comprising a plurality of orientations A, said plurality of orientations A being at a plurality of non-zero angles relative to said trace, said plurality of orientations A resulting in microstructural asymmetry along said trace, said asymmetry being relative to the mid-point of said trace, said plurality of electrical characteristics comprising electrical characteristic B, said asymmetry resulting in substantial difference in said electrical characteristic B in the two opposite directions of said trace, said difference enhancing said dipole.

The electrically conductive material in the electret material that is in the power source of this invention preferably comprises a plurality of grains, said plurality of grains having crystallographic directions, said directions comprising crystallographic direction C, said crystallographic direction C being substantially parallel to said trace.

The power source of this invention preferably comprises two electrical leads, said leads being electrically conductive and being electrically connected to said electrically conductive material at two separate points, said two points being along said line.

The electrical leads of the power source of this invention are made of a material of high electrical conductivity, such as aluminum or copper. They are preferably connected to said electrically conductive material by using an electrically conductive interface medium. The medium is positioned between the electrically conductive material and each of the two electrical leads. The medium is selected from the group consisting of solder material, brazing material, welding material, electrically conductive paint, electrically conductive adhesive, metal particle paste, carbon black paste, and colloidal graphite. Alternately, the leads are attached to the electret material by fastening. The fastening approach gives higher contact electrical resistance than the approach involving an electrically conductive medium, so it is less attractive.

This invention provides a structural material comprising an electret material, said electret material comprising electrically conductive material, said electrically conductive material exhibiting substantial electrical conductivity, said electrically conductive material comprising mobile charge carriers, said carriers exhibiting concentration, said concentration exhibiting gradient, said gradient being along a line in said electrically conductive material, said electrically conductive material also comprising electric dipole, said dipole being created by said carriers, said dipole consisting of positive charge center and negative charge center, said line consisting of a trace from said positive charge center to said negative charge center, said trace being along the path of least electrical resistance, said electrically conductive material being electrically continuous along said trace, said electrically conductive material also comprising microstructure, said microstructure comprising a plurality of microscopic features, said plurality of microscopic features being positioned along said trace, said plurality of microscopic features interacting with said carriers, said interaction enhancing said dipole.

The plurality of microscopic features in the electrically conductive material that is in the structural material of this invention exhibits orientations, and the electrically conductive material exhibits a plurality of electrical characteristics, said orientations comprising a plurality of orientations A, said plurality of orientations A being at a plurality of non-zero angles relative to said trace, said plurality of orientations A resulting in microstructural asymmetry along said trace, said asymmetry being relative to the mid-point of said trace, said plurality of electrical characteristics comprise electrical characteristic B, said asymmetry resulting in substantial difference in said electrical characteristic B in the two opposite directions of said trace. This difference enhances said dipole.

The electrically conductive material that is in the structural material of this invention preferably comprises a plurality of grains, said plurality of grains having crystallographic directions, said directions comprising crystallographic direction C, said crystallographic direction C being substantially parallel to said trace.

This invention provides a new class of electric power source. It is in the form of an electrically conductive electret that does not need poling for the formation of its electric dipole. The electret comprises mobile charge carriers selected from the group consisting of electrons (negatively charged), holes (positively charge) and ions. The carrier concentration exhibits a gradient along a line, thus resulting in a positive charge center and a negative charge center at the two ends of the line. The line does not have to be straight. In case that the carriers are electrons (as in the case of typical metals), the carrier concentration is relatively high in the vicinity of the negative charge center. In case that the carriers are holes, the carrier concentration is relatively high in the vicinity of the positive charge center.

Figure 2:
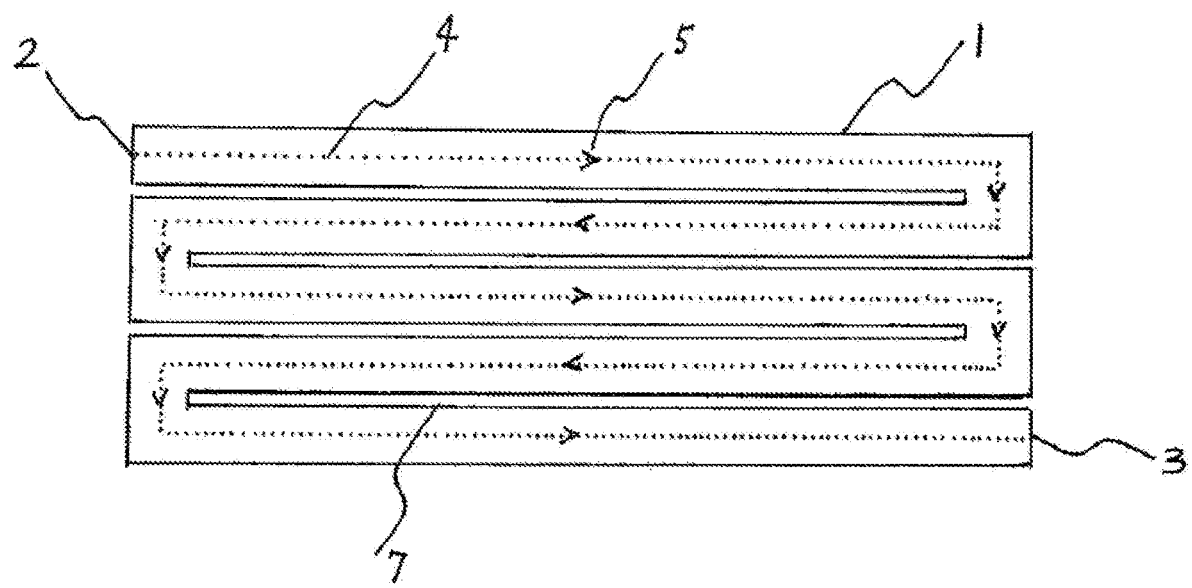
FIG. 2 is a schematic illustration of another example of an electret material of this invention. It comprises electrically conductive material 1, which is in the form of a sheet with slots 7. The sheet comprises positive charge center 2, negative charge center 3, line 4 connecting 2 and 3, and trace 5 (in the direction from 2 to 3 and taking the path of least electrical resistance between 2 and 3). The positive charge center 2 is near one end of the trace, whereas the negative charge center is near the other end of the trace. An example of a path of relatively high resistance is one along the straight line from 2 to 3; the high resistance is because this path cuts across the slots, which are occupied by the air in the environment.

A material of the electret of this invention is electrically continuous along said line. This line is preferably long, because the electric field provided by the electret increases linearly with increasing length of the line. Therefore, the bending of the line is recommended. However, this bending is subject to the condition that the line takes the path of least electrical resistance. As a consequence, the directional dependence of the resistance of the electrically conductive material should be tailored to promote a long length of the line. The bent line can be in various geometries, such as spiral and serpentine geometries. FIG. 2 illustrates a serpentine geometry, which is enabled by the slots in the electrically conductive material sheet. The slots are occupied by air in the environment and air is essentially an electrical insulator.

That DC current can flow through the electret of this invention allows the electret to function as a DC power source. The power density (power per unit volume) of the electret is given by $E^2/\rho$, where E is the electret field in the electret and $\rho$ is the electrical resistivity of the electret material along said line. Therefore, for attaining a high power density, a high value of E and a low value of $\rho$ are preferred.

High mobility of the carriers is also important for providing high electrical conductivity to the electrically conductive material of this invention. A high conductivity (low resistivity) is valuable for resulting in high power density, which is given by $E^2/\rho$, where E is the electret field in the electret and $\rho$ is the electrical resistivity.

A monolithic piece of material is physically continuous in at least one dimension. For example, carbon fiber is physically continuous along the fiber axis. Physical continuity results in electrical continuity. Inadequate physical continuity results in inadequate electrical continuity.

The electrically conductive material in the electret material of this invention is preferably physically continuous along said line. In case that the electrically conductive material is not physically continuous along this line, but comprises a plurality of physically continuous segments, such that each segment lies on this line and some or all of the segments are physically discontinuous from one or both of their adjacent segments, the segments that are physically discontinuous from one another can be rendered electrical continuity between them by connecting the proximate ends of these segments with an electrical connection, which can comprise an electrically conductive material such as a metal wire. The electrical resistance associated with the electrical connection is preferably small, as needed to obtain a high power density.

Due to the high conductivity (i.e., low resistivity) of the electrically conductive material in the electret of this invention, DC electric current can flow through these electrets when the two electrodes (electrical contacts) applied to the two ends of the line (or line segment) are electrically connected. The current (with the direction being the same as the direction of the flow of the holes and opposite to the direction of the flow of the electrons) flows from the positive charge center to the negative charge center along the circuit rendered by the electrical connection.

Akin to a battery, an electret of this invention provides a voltage while allowing a current to flow through it. However, the science and structure are very different from those of a battery.

The electrets of this invention do not need any electric current for charging, which just requires the electrets to sit in an open-circuit condition for a short period of time (such as 400 s). In contrast, a battery requires a current in order to be charged.

Electrolytes are absent in the electrets of this invention. In contrast, a battery comprises an electrolyte, which is commonly a liquid. The electrolyte contributes to causing hazards in the use and disposal of batteries.

Electrochemical electrodes and chemical reactions are absent in the electrets of this invention. The absence of electrodes simplifies implementation and allows long service life. The absence of reactions improves safety and promotes long service life. In contrast, a battery comprises electrochemical electrodes, which participate in the electrochemical reaction that results in the battery function. When either of the electrochemical electrodes is consumed, a battery stops functioning.

The electrets of this invention are monolithic materials that are electrical conductors. The electrical conductor has mobile charge carriers, which are preferably electrons and/or holes. Examples of such electrical conductors are metals, alloys, steel, stainless steel, aluminum, copper, nickel, tin, tin-lead, metal-matrix composites, carbons, graphite, graphene, isotropic graphite (polycrystalline graphite with little or no preferred orientation of the carbon layers), exfoliated-graphite-based flexible graphite ("flexible graphite" being a technical term that refers to sheet graphite that is formed by the compaction of exfoliated graphite and exhibiting strong preferred orientation of the carbon layers in the plane of the sheet), carbon fibers, metal-coated carbon fibers, carbon nanofibers, carbon nanotubes, polymer-matrix composites, cement-matrix composites, and carbon-carbon composites. Carbon-carbon composite refers to carbon fiber carbon-matrix composite.

The mobile charge carriers can be ions. Examples of electrical conductors with ions as the mobile charge carriers are cement, cement mortar, concrete, inorganic electrolytes and solid polymer electrolytes, oxides, sulfides, oxysulfides, nitrides, germanides, silicides, sulfonated tetrafluoroethylene based fluoropolymer-copolymers, polymers containing solvating heteroatoms and forming conductive complexes with alkali salts, poly (ethylene oxide), polycarbonate, polysiloxane, succinonitrile, poly(ethylene glycol)diacrylate, polymer-ceramic composites, and organic-inorganic hybrid composites.

For electret materials that are deformable (e.g., the metals, alloys and metal-matrix composites), they are preferably cold worked. Cold work refers to mechanical deformation performed below the recrystallization temperature. An example of cold working is mechanical deformation by rolling. The cold work is performed sequentially and continuously along said line (trace), which connects the positive charge center and the negative charge center. The cold work affects the microstructure of the electret material, thereby enhancing the electric dipole in the electret. The direction of the working affects the direction associated with the polarity of the electric field in the electret. For example, the positive end of the electret voltage is where the rolling-induced plastic flow originates. In addition, cold work enhances the preferred crystallographic orientation. A high degree of preferred crystallographic orientation is preferred for enhancing the electret.

An electret of this invention is discharged by electrically short-circuiting the two ends of said line. This line connects the positive charge center and the negative charge center.

An electret of this invention is charged by subjecting the electret to an electrically open-circuit condition.

An electrical conductor that comprises an electret of this invention exhibits length, which is along said line. The length preferably ranges from 10 mm (i.e., 10 millimeters) to 1000000 m (i.e., 1000000 meters).

The materials of the electrets of this invention include structural materials (e.g., steel, aluminum and carbon fiber composites). This means that this invention enables a structural material to serve as a power source. In other words, this invention enables self-powered structures. The self-powering function lasts as long as the structure. In contrast, the self-powering function that is rendered by the embedment of a battery or battery components in a structural material has a much shorter service life than the structure itself.

The electret field provided by the electrets of this invention increases essentially linearly with increasing distance between the electrodes (electrical contacts) used to measure the electric field. As a result, the power density of a power source based on an electret of this invention increases with increasing size of the electret material. This means that increasing the size of a structure makes the power source more effective, without the need for any required additional component or any required modification. Therefore, the technology is particularly suitable for large structures, which are common. In contrast, a self-powered structure based on the prior-art technology of embedding batteries or battery components in a structural material requires more and more batteries as the size of the structure increases. This is, because each battery can provide only a limited amount of power and the power density of the overall structure needs to be maintained as the structure becomes larger.

One of the materials of the electrets of this invention is steel, which is a dominant structural material. Steels (low carbon steel, stainless steel, alloy steels, galvanized steel, etc.) are widely used for pipelines (e.g., oil pipelines), industrial piping, sewage pipes, casings (e.g., casings for oil wells), cranes, automobile (trucks, buses, trailers, etc.), ships (cruise ships, cargo ships, oil tankers, etc.), submarines, storage tanks, buildings (e.g., the frame, roofing, concrete reinforcement, garage doors, flag poles, etc.), bridges (e.g., tendons, the cables of a cable-stayed bridge, etc.), highway infrastructures (e.g., roadside railings, light poles, road sign support, expansion joints, etc.), towers, wind turbine poles, etc. The technology of this invention enables these large steel structures to be able to provide electric power, whether the power is for the use by these structures themselves, for microgrids, or for the electrical grid.

The materials of the electrets of this invention include aluminum and its alloys, which are dominant lightweight structural materials. Aluminum and its alloys are used for numerous building components, such as house siding (for the exterior wall surface), roofing, frames, railings, etc. This invention enables these building components to serve not only the structural function, but also the function of serving as a power source. The power may be used by the building, thus making the building more attractive environmentally (i.e., "greener").

One of the materials of the electrets of this invention is carbon fiber polymer-matrix composite, which is a dominant lightweight structural material. This type of composite is widely used for airframes, satellites and fishing poles, and is increasingly used for automobile. The technology of this invention enables these large composite structures to be able to provide electric power, thus reducing the dependency of these structures on non-structural power sources (such as batteries, solar cells and gasoline).

One of the materials of the electrets of this invention is carbon-carbon composite, i.e., carbon fiber carbon-matrix composite, which is a dominant high-temperature lightweight structural material. This type of composite is widely used for missiles, missile launchers, and reentry space vehicles. The technology of this invention enables these large composite structures to be able to provide electric power, thus reducing the dependency of these structures on non-structural power sources (such as batteries, solar cells and microgrids).

This invention also provides a power source in the form of a nonstructural material, such as exfoliated-graphite-based flexible graphite. Due to its high thermal conductivity in the plane of the exfoliated-graphite-based flexible graphite sheet, this material is used as a heat spreader in microelectronics (e.g., computers and cellular phones). This invention enables this material to serve both as a heat spreader and as a power source, thereby reducing the need for batteries to power the microelectronics. Batteries add much volume to the electronics, in addition to being a fire hazard.

This invention also provides a power source in the form of a nonstructural material, such as copper. Due to its high electrical conductivity, copper is a dominant electrical conductor material that is used in electronics (e.g., computers). Thus, electronics can use copper, for example, as both electrical wiring and power source. This means that the copper becomes multifunctional. The wiring can be in the form of wires, thick-film lines (such as those made by the screen printing of a metal particle paste) or thin-film lines (such as those made by vacuum evaporation or sputtering). The cross-sectional area of a wire is large compared to that of a thick-film line; the cross-sectional area of a thick-film line is large compared to that of a thin-film line. In contrast, the prior art uses batteries to provide power to electronics.

The power source of this invention comprises the electret of this invention, two electrical leads (wiring) in electrical contact with the electret, and optionally a load resistor in the circuit comprising the electret. The electret material and its dimensions are to be chosen in accordance with the electret material's electrical characteristics (electric field, electrical conductivity, and effect of dimensions on the electric field), as needed for the power source to provide a substantially high value of the electric power density (electric power per unit volume).

Due to the low electrical resistance of the electret of this invention, the load resistor that is electrically in series with the electret material for the purpose of using the electret as a power source preferably has an electrical resistance that is comparable to or lower than that of the electret.

The materials of the electrets of this invention may degrade during use in various environments. The degradation affects the electric dipole (electric field) in the electret, partly due to the effects of the degradation on the electrical conductivity and electric permittivity. Thus, by measuring the electric field or the associated voltage, current or capacitance, the degree of degradation (damage) can be assessed. This means that the degradation is sensed without using any embedded or attached sensor, as the electret is its own sensor. Furthermore, no input stimulus (such as stress/strain) is needed for the sensing to take place, in contrast to a dynamic stress/strain stimulus that is required for a piezoelectricity-based degradation (damage) self-sensing structural material.

One of the materials of the electrets of this invention is carbon-carbon composite, which is used for high-temperature structures, such as missile launchers. At high temperatures in the presence of air (i.e., oxygen), a carbon-carbon composite tends to be oxidized and consequently experience mass loss. Due to the severe mass loss and associated degradation of the carbon-carbon composite during normal use of the missile launchers, the condition of the composite needs to be assessed regularly. This invention allows the condition of missile launchers to be sensed through measurement of the electric field (or the associated voltage, current or capacitance) in the associated electrets.

One of the materials of the electrets of this invention is isotropic graphite, which is widely used as an electrochemical electrode for processing metal ores in the production of metals such as aluminum. These electrodes may degrade during extended use. This invention enables the electrodes to be able to sense their own condition (e.g., the degree of degradation) through the effect of degradation on the electric field in the electret.

The electrets of this invention can be subjected to a stress/strain, which affects the electric dipole (electric field) in the electret. Thus, the input mechanical energy is converted to electrical energy. The input stress can be static or dynamic. In contrast, piezoelectrets and piezoelectric materials of the prior art can perform this energy conversion only if the stress is dynamic (i.e., time-varying, as for the stress associated with vibrations). The conversion of mechanical energy to electrical energy is useful for sensing the stress (which is proportional to the strain in the elastic regime) and for mechanical energy harvesting (which is useful for converting the energy of mechanical input to electricity). Thus, the effect of stress on the electric dipole (electric field) in the electret in the form of a structural material allows the structural self-sensing of stress/strain.

Due to the degradation (damage) affecting the extent of the effect of stress/strain on the electric dipole (electric field) in the electret, the structural self-sensing of degradation can be achieved by measuring the extent of the effect of stress/strain on the electric dipole (electric field) in electret. However, the abovementioned (last paragraph) electret-based structural self-sensing of degradation based on the effect of the degradation on the electric dipole is advantageous over this method of structural self-sensing of degradation, due to the absence of need for a stress/strain stimulus in order for the abovementioned (last paragraph) electret-based degradation self-sensing to take place.

By using its electret behavior, steel used in a building can be used to provide power. In addition, due to the effect of stress/strain on the electric dipole, the steel senses the stress/strain (whether static or dynamic stress) exerted on the steel. An example of dynamic stress is the live load exerted by people moving in the building. Thus, through the effect of stress/strain on the electric dipole, the steel senses the people in the building. In other words, the number and location of the people in the building can be monitored through measuring the electrical output of the electret. In particular, the number of people in a HVAC (heating, ventilation and air conditioning) zone of a building can be monitored so as to control the heating, cooling and ventilation in accordance with the HVAC zone occupancy for the purpose of reducing the energy consumption of the building.

By using its electret behavior, steel used in trucks, buses, trailers and other automobile can be used to provide power. In addition, by using the effect of stress/strain on the electric dipole, the steel also senses the stress/strain (whether static or dynamic) exerted on the steel. The stress relates to the occupancy of the vehicle. For the purpose of safety and inventory control, it is particularly valuable for the amount of goods loaded on a truck to be sensed.

By using the effect of stress/strain on the electric dipole, steel used in industrial piping or storage tanks can be used not only to provide power, but also to sense the stress/strain (whether static or dynamic) exerted on the steel. The stress relates to the amount of material in the piping or storage tanks. This information is valuable for operation control.

By using the effect of stress/strain on the electric dipole, steel used in cranes can be used not only to provide power, but also to sense the stress (whether static or dynamic stress) exerted on the steel. This information is valuable for operation control and safety enhancement.

Due to its resiliency in the direction perpendicular to the plane of its sheet, exfoliated-graphite-based flexible graphite is used as a gasket material that can withstand harsh environments (i.e., environments that are chemically and/or thermally harsh). This gasket material replaces asbestos, which is carcinogenic. The gasket serves as a sealant when it is squeezed between two surfaces. This is why the resiliency is needed. There is stress associated with the squeezing. If the stress diminishes, the sealing function degrades. Due to the effect of stress/strain on the electric dipole, a gasket made of exfoliated-graphite-based flexible graphite can sense the stress that the gasket experiences, whether the stress is static or dynamic. Thus, the quality of the sealing can be monitored through measuring the electric field, voltage or capacitance in the electret.

EXAMPLES

Example 1

This Example pertains to the electret behavior of copper, which serves as the electrically conductive material of the electret.

The copper is electrolytic tough pitch copper (alloy 110). This is the most common copper alloy. It contains at least 99.9 wt. % copper, with approximately 0.04 wt. % oxygen. It can be annealed at temperatures ranging from 700° F. (371° C.) to 1200° F. (649° C.). The alloy without cold work is in the annealed state, and is in the form of foils of nominal thickness 0.010 inch (0.25 mm). Specimens in the form of rectangular bars with different in-plane dimensions are obtained by manual cutting of the foils. The long direction of the bar is along the direction of stress application and the direction of voltage/capacitance/resistance/strain measurement. No poling is conducted. No depolarization is conducted prior to testing.

Mechanical rolling (cold unidirectional rolling) is conducted at room temperature without lubrication, using a conventional rolling mill with gear ratio 4:1, roller width 90 mm and roller diameter 42.6 mm. The rolling direction is the same as the direction of subsequent electrical measurements. The thickness, width and cross-sectional area before the rolling are 0.257 mm, 9.53 mm and 2.45 mm$^2$, respectively. Seven passes of rolling are conducted successively on the same copper bar, and electret testing is conducted after each pass. The thickness is decreased by the rolling, while the width is increased. As a result, the cross-sectional area is decreased. The cold work (fractional decrease in cross-sectional area relative to that of the bar without cold work) resulting from the rolling is up to 37.0%.

Electret testing primarily involves measuring the DC electric field in the absence of stress application. Two electrodes are applied on the copper specimen bar for measuring the DC voltage. The two electrodes are along a line, which is along the direction of voltage measurement. Each electrode is aluminum foil attached to the specimen by using electrically conductive paint (silver paint). The DC voltage between the two electrodes is measured using a precision digital multimeter. The measured DC voltage is divided by the proximate distance between the two electrodes in order to obtain the electric field. Concerning the multimeter, the input resistance is greater than 100 G$\Omega$ and the voltage resolution is 1 nV for the voltage range ($\leq$200 mV) involved.

Figure 3:
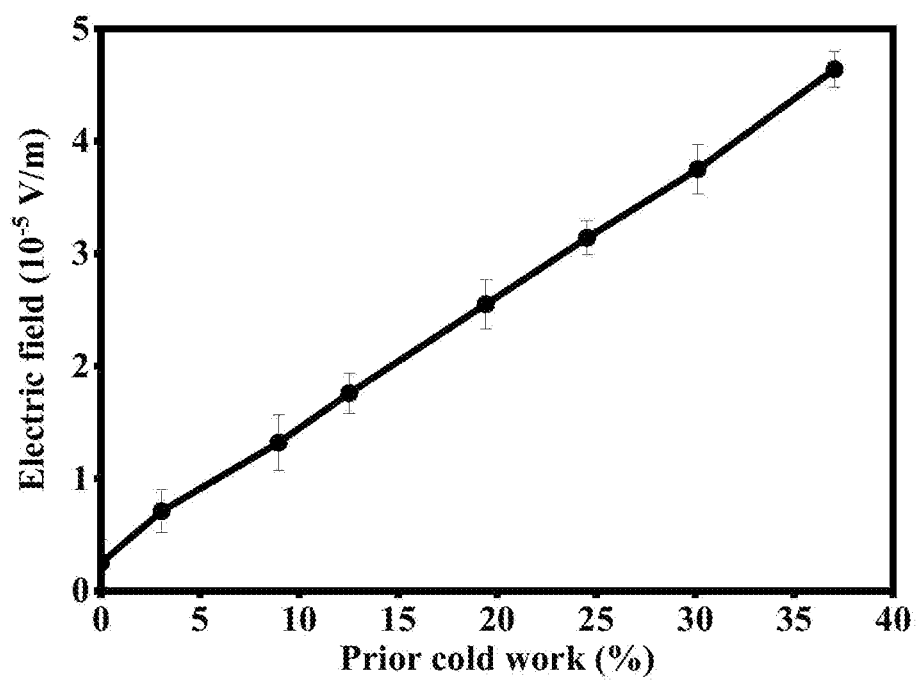
FIG. 3 illustrates the effect of prior cold work on the electric field (measured with the inter-electrode distance of 25.4 mm) for the case of copper (in the form of a bar cut from a copper foil) as the electrically conductive material. The cold work is performed by rolling at room temperature in the direction of the electric field, with the different degrees of cold work corresponding to different numbers of passes in the rolling. Mathematically, cold work is defined as the fractional reduction in cross-sectional area. This area is the product of the thickness and width of the copper bar. The rolling decreases the thickness, but increases the width, such that the cross-sectional area is decreased. The electric field is measured for inter-electrode distance l=50.8 mm. The electric field increases monotonically with increasing cold work.

The electret in copper exhibits an electric field. Upon switching the two electrical leads used to measure the voltage, the measured voltage changes sign. This electric field increases monotonically with increasing amount of prior cold work, as shown in FIG. 3. It increases linearly with increasing inter-electrode distance, as shown in FIG. 4 for the copper without cold work.

Example 2

This example pertains to the effect of stress on the electric dipole for the case of copper as the electrically conductive material in the electret. The copper is the same as the copper foil (without cold work) in Example 1.

Figure 5:
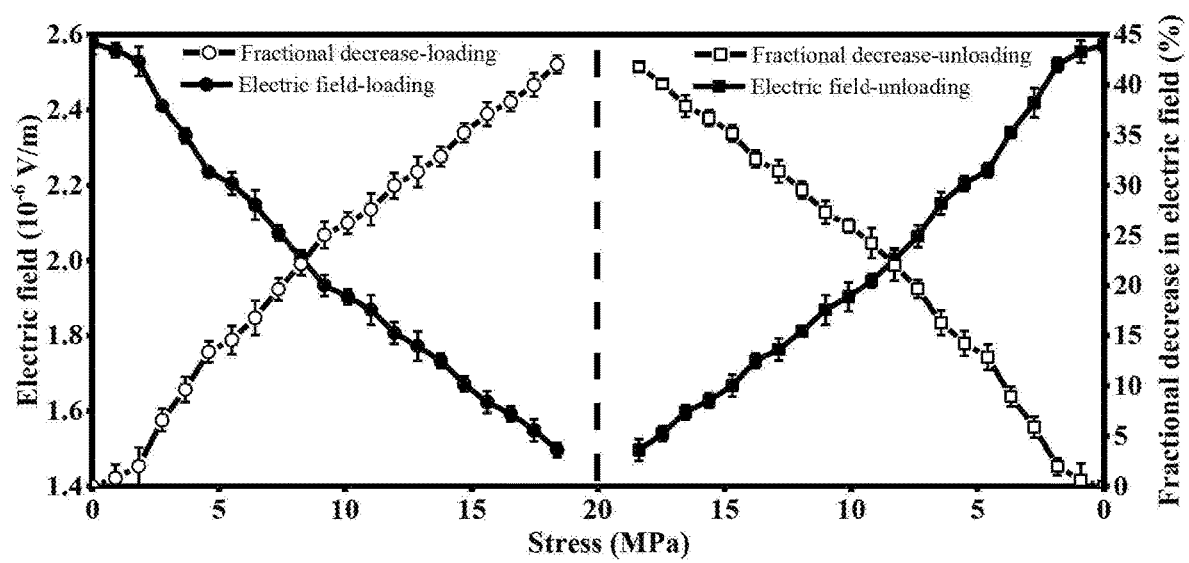
FIG. 5 illustrates the effect of tensile stress in the elastic regime on the electric field and the fractional decrease in electric field due to the stress during loading (left panel) and subsequent unloading (right panel) for the case of copper (in the form of a bar cut from copper foil without cold work) as the electrically conductive material. The electric field is measured for inter-electrode distance l=25.4 mm.
Figure 6:
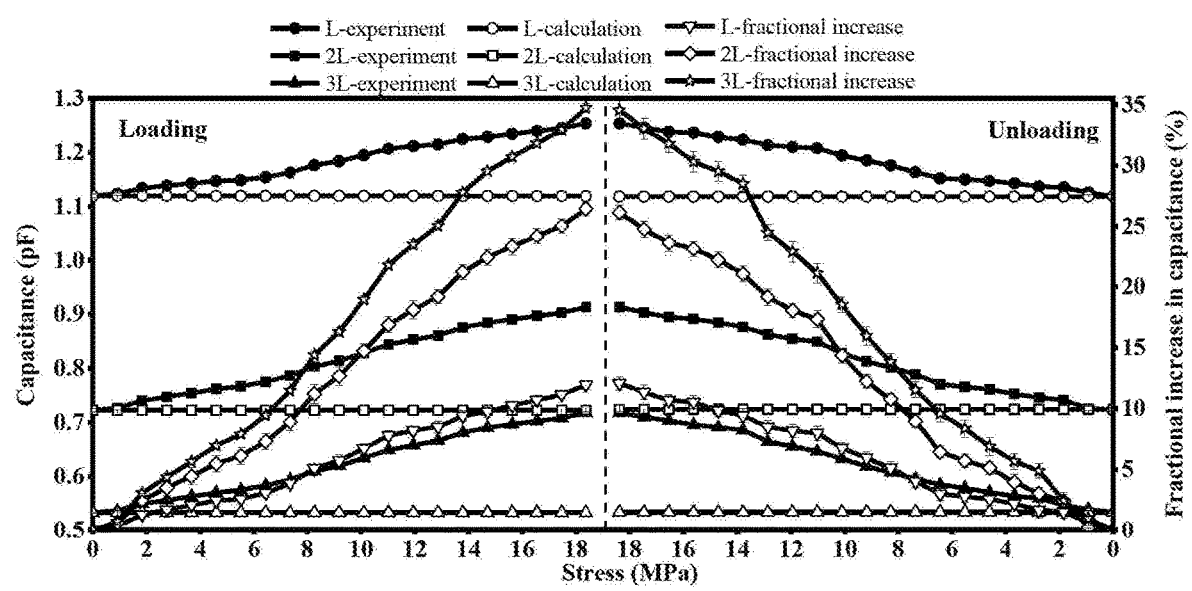
FIG. 6 illustrates the effect of tensile stress in the elastic regime on the capacitance for the case of copper (in the form of a bar cut from copper foil without cold work) as the electrically conductive material during loading (left panel) and subsequent unloading (right panel). Inter-electrode distance l=L, 2L and 3L, with L=25.4 mm. The capacitance change calculated based on the dimensional change alone is a slight decrease (since the strain is an elongation under the tensile stress), in contrast to the substantial increase of the measured capacitance. This difference between the calculated and measured capacitance changes indicates that the dimensional changes cannot explain the observed capacitance increase, which is a consequence of the effect of stress on the electric dipole in the electret.

The effect of stress on the electric dipole is a phenomenon that gives an electric output in response to a stress input. The electric output can be the electric field (which relates to the voltage) or the capacitance. An increase in the tensile stress in the elastic regime causes the electric field output to decrease monotonically and reversibly (FIG. 5), such that the fractional decrease in electric field reaches 43% at the maximum stress of 18 MPa. Furthermore, an increase in the tensile stress in the elastic regime causes the capacitance to increase monotonically and reversibly (FIG. 6). Thus, stress sensing can be achieved by measuring the electric field or the capacitance. This means self-sensing, as the copper senses itself.

In measuring the electric field, a DC voltmeter (multimeter) is used, along with two electrodes that are attached to the copper specimen at two points that are both on the line that is in the direction of the electric field being measured. The electrodes are aluminum foil, which is attached to the copper specimen by using silver paint.

In measuring the capacitance, an LCR operating at 2 kHz is used, along with two electrodes that are attached to the copper specimen at two points that are both on the line that is in the direction of the capacitance being measured. The electrodes are aluminum foil, which is attached to the copper specimen by using double-sided adhesive tape. The tape serves as the dielectric film as well as the joining agent.

Example 3

This example pertains to the effect of the inter-electrode distance (up to 1280 m) on the electric field for the case of copper (copper wire) as the electrically conductive material in the electret.

The wire has American wire gauge No. 28, with diameter 0.321 mm (excluding the enamel insulating coating). It is spirally wound. The inter-electrode distance is increased in steps of 8 m (meters) and the enamel coating is removed at the points of the electrodes by using sandpaper prior to the application of silver paint.

The linearity of the electric field vs. the inter-electrode distance/up to 1280 m is shown in FIG. 7. This indicates that the linearity is maintained even at very large values of l. This behavior is valuable for using large structures as power sources.

Example 4

This example pertains to the power density for the case of copper (37.0% cold worked copper foil) as the electrically conductive material in the electret. The copper is the same as the cold-worked copper in Example 1.

The electrical resistivity is $1.49 \times 10^{-8}$ $\Omega$m. The electric field at inter-electrode distance l=25.4 mm is $4.64 \times 10^{-5}$ V/m. The fractional increase in electric field when l is tripled from 40 mm to 120 mm is 0.596%. Thus, based on the linearity of the electric field with l, for l=1200 m, the electric field is $2.81 \times 10^{-3}$ V/m and the power density (equal to the square of the electric field divided by the electrical resistivity) is 530 W/m$^3$.

Example 5

This example pertains to the electret behavior of stainless steel in the form of a bar cut from a foil of thickness 25 $\mu$m. The stainless steel is type 302 (full hard, austenitic, non-magnetic), with composition 70 wt. % Fe, 18 wt. % Cr, 8 wt. % Ni, 1.5 wt. % Mn and 0.02 wt. % C.

The electric field is $2.794 \times 10^{-5}$ V/m for inter-electrode distance l=120 mm. The electrical resistivity is $(7.56 \pm 0.09) \times 10^{-7}$ $\Omega$·m. The fractional increase in electric field when l is tripled from 40 mm to 120 mm is 2.008%. Based on the linearity of the electric field with l, the power density (equal to the square of the electric field divided by the electrical resistivity) is 41.8 W/m$^3$ for l=1200 m.

Example 6

This example pertains to the charge-discharge characteristics of an electret-based power source in the form of 37.0% cold worked copper. The material is the same as the 37.0% cold worked copper in Example 1.

Charge-discharge characteristics are important descriptions of the performance of an electric power source. Discharge refers to the process of drawing electric power from the power source. Charge refers to the process of restoring the ability of the power source to provide power. During discharge, the electric field in the electret decreases. During charge, as conducted after discharge, the electric field in the electret increases.

The electric field is measured for inter-electrode distance l=40 mm. Discharge testing is conducted by measuring the electric field vs. time during short-circuit discharge. During the discharge, the electric field is measured during short open-circuit periods (2 seconds each). The charge is conducted under the open-circuit condition for the purpose of restoring the electret to its inherent condition.

Figure 8:
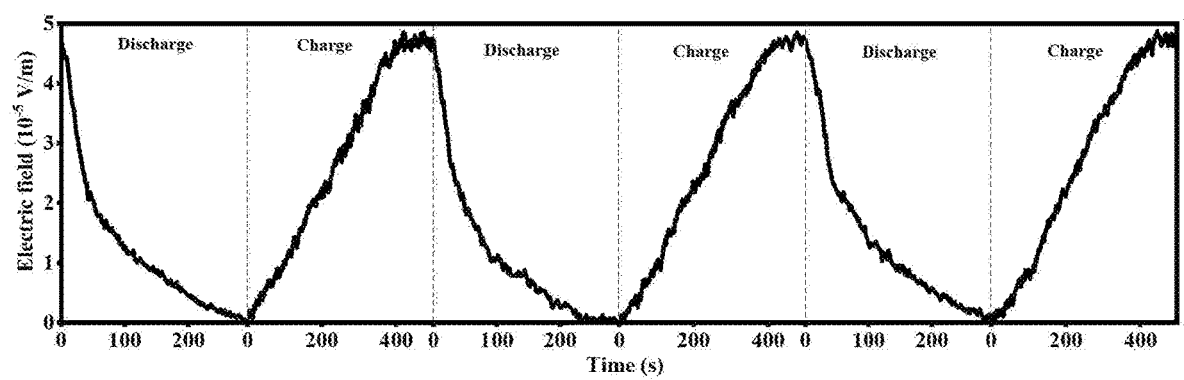
FIG. 8 illustrates the charge-discharge characteristics for copper in the form of a bar cut from a 37.0% cold-worked copper foil. The electric field is shown as a function of time for three successive cycles of discharge and charge. There is no pause between discharge and charge. There is no pause between one cycle and the next cycle. The discharge is conducted under the short-circuit condition, such that the electric field is measured during short open-circuit periods (2 seconds each). The charge is conducted under the open-circuit condition. The electric field is measured for inter-electrode distance l=40 mm. The electric decreases during discharge and increases during charge.

FIG. 8 shows three successive cycles of discharge and charge. The electric field changes reversibly in all cycles. During discharge, the electric field decreases with time, reaching essentially zero at 300 s. During charge, the electric field increases with time, reaching the maximum value of $4.5 \times 10^{-5}$ V/m at 400 s, beyond which the electric field essentially does not increase further. This maximum value is close to the value of $4.6 \times 10^{-5}$ V/m before discharge. The characteristics of discharge and charge are similar for the three cycles.

Example 7

This example pertains to the electrical asymmetry associated with an electret for the case of the electrically conductive material being low carbon steel in the form of a bar cut from a foil of thickness 25 µm. The low carbon steel is type C1010 (full hard), with composition 99.43 wt. % Fe, 0.35 wt. % Mn and 0.06 wt. % C.

Four electrodes (electrical contacts) are applied at four points along the length of the bar, i.e., along the direction of the electrical measurement. A constant DC current (1 mA, as provided by a DC current source) is passed along the length of the bar using two outer electrodes. The DC voltage is measured (using a multimeter) between the two inner electrodes as a function of the time of current application. The voltage divided by the fixed current is the apparent resistance. Immediately after 360 s (6 min) of current application, the polarity of the current is suddenly reversed, while the voltage measurement continues.

The apparent resistance, which is higher than the true resistance, increases monotonically with the time of the current application. FIG. 9 shows plots of the fractional change in apparent resistance vs. time during current application and polarity reversal. The rate of apparent resistance increase diminishes with increasing time of current application. This is because the polarization-induced opposing electric field hinders further polarization, so that the polarization slows down. Upon polarity reversal, the apparent resistance immediately decreases to a value that is well below the initial resistance. In case of depolarization having been conducted immediately prior to the testing, the polarity reversal causes the apparent resistance to change roughly symmetrically about the initial resistance, so that the fractional change in apparent resistance relative to the initial resistance is roughly equal in magnitude, though opposite in sign, immediately before and immediately after the polarity reversal (FIG. 9(b)). However, in case of the absence of depolarization, the curve of the apparent resistance vs. time upon polarity reversal is asymmetrical (FIG. 9(a)).

The asymmetry in FIG. 9(a) indicates the presence of an inherent directional asymmetry in the absence of depolarization. This asymmetry is due to the occurrence of an electret.

Although preferred embodiments have been depicted and described in detail herein, it will be apparent to those skilled in the relevant art that various additions, substitutions, modifications and the like can be made without departing from the spirit of the invention and these are therefore considered to be within the scope of the invention as defined in the claims which follow.

What is claimed:

1. An electret material,
    said material exhibiting substantial electrical conductivity,
        said material comprising mobile charge carriers,
            said carriers exhibiting concentration,
                said concentration exhibiting gradient,
                    said gradient being along a line in said material,
            said material also comprising electric dipole,
                said dipole being created by said carriers,
                said dipole consisting of positive charge center and negative charge center,
            said line consisting of a trace from said positive charge center to said negative charge center,
                said trace being along the path of least electrical resistance,
            said material being electrically continuous along said trace,
            said material also comprising microstructure,
                said microstructure comprising a plurality of microscopic features,
                    said plurality of microscopic features being positioned along said trace,
                    said plurality of microscopic features interacting with said carriers,
                        said interaction enhancing said dipole.

2. An electret material of claim 1, wherein said dipole exhibits electric field, said electric field ranging from $10^{-6}$ V/m to 1 V/m.

3. An electret material of claim 1, wherein said electrical conductivity ranges from $10^3 \Omega^{-1} \cdot m^{-1}$ to $10^8 \Omega^{-1} \cdot m^{-1}$.

4. An electret material of claim 1, wherein said material is selected from the group consisting of metals, alloys, copper, nickel, steel, stainless steel, alloy steels, galvanized steel, tin, tin-lead, metal-matrix composites, carbons, carbon fibers, exfoliated-graphite-based flexible graphite, carbon nanotubes, carbon nanofibers, graphite, graphene, isotropic graphite, carbon-carbon composites, ceramic-matrix composites, cement-matrix composites, polymer-matrix composites, and carbon-matrix composites.

5. An electret material of claim 1, wherein said plurality of microscopic features exhibit orientations, and said material exhibits a plurality of electrical characteristics,
    said orientations comprising a plurality of orientations A,
        said plurality of orientations A being at a plurality of non-zero angles relative to said trace,
        said plurality of orientations A resulting in microstructural asymmetry along said trace, said asymmetry being relative to the mid-point of said trace,
    said plurality of electrical characteristics comprising electrical characteristic B,
        said asymmetry resulting in substantial difference in said electrical characteristic B in the two opposite directions of said trace,
        said difference enhancing said dipole.

6. An electret material of claim 1, wherein said material comprises a plurality of grains,
    said plurality of grains having crystallographic directions,
        said directions comprising crystallographic direction C,
            said crystallographic direction C being substantially parallel to said trace.

7. An electret material of claim 1, wherein said carriers are selected from the group consisting of electrons, holes and ions.

8. The electret material of claim 1, wherein said microscopic features are selected from the group consisting of crystallographic planes, crystallographic directions, grain boundaries, crystallite boundaries, phase boundaries, interfaces, crystal lattice distortions, grain distortions, defects, dislocations, disclinations, twins, twinning faults, stacking faults, vacancies, Schottky defects, Frenkel defects, impurities, precipitates, pores, voids, channels and cracks.

9. An electric power source,
    said power source exhibiting the ability to allow current to pass through,
    said power source also exhibiting the ability to provide DC power,
    said source comprising electret,
        said electret comprising electret material,
            said electret material exhibiting substantial electrical conductivity,
                said electret material comprising mobile charge carriers,
                    said carriers exhibiting concentration,
                        said concentration exhibiting gradient,
                            said gradient being along a line,
                said electret material also comprising electric dipole,
                    said dipole being created by said carriers, said dipole consisting of positive charge center and negative charge center,
said line being a trace from said positive charge center to said negative charge center,
said trace being along the path of least electrical resistance,
said electret material being electrically continuous along said trace,
said electret material also comprising microstructure,
said microstructure comprising a plurality of microscopic features,
said plurality of microscopic features being positioned along said trace,
said plurality of microscopic features interacting with said carriers,
said interaction enhancing said dipole.

10. The power source of claim 9, wherein said electret material is selected from the group consisting of metals, alloys, copper, nickel, steel, stainless steel, alloy steels, galvanized steel, tin, tin-lead, metal-matrix composites, carbons, carbon fibers, exfoliated-graphite-based flexible graphite, carbon nanotubes, carbon nanofibers, graphite, graphene, isotropic graphite, carbon-carbon composites, ceramic-matrix composites, cement-matrix composites, polymer-matrix composites, and carbon-matrix composites.

11. The power source of claim 9, wherein said plurality of microscopic features exhibit orientations, and said electret material exhibits a plurality of electrical characteristics,
said orientations comprising a plurality of orientations A,
said plurality of orientations A being at a plurality of non-zero angles relative to said trace,
said plurality of orientations A resulting in microstructural asymmetry along said trace,
said asymmetry being relative to the mid-point of said trace,
said plurality of electrical characteristics comprising electrical characteristic B,
said asymmetry resulting in substantial difference in said electrical characteristic B in the two opposite directions of said trace,
said difference enhancing said dipole.

12. The power source of claim 9, wherein said electret material comprises a plurality of grains,
said plurality of grains having crystallographic directions,
said directions comprising crystallographic direction C,
said crystallographic direction C being substantially parallel to said trace.

13. The power source of claim 9, wherein said carriers are selected from the group consisting of electrons, holes and ions.

14. The power source of claim 9, wherein said microscopic features are selected from the group consisting of crystallographic planes, crystallographic directions, grain boundaries, crystallite boundaries, phase boundaries, interfaces, crystal lattice distortions, grain distortions, defects, dislocations, disclinations, twins, twinning faults, stacking faults, vacancies, Schottky defects, Frenkel defects, impurities, precipitates, pores, voids, channels and cracks.

15. The power source of claim 9, wherein said dipole exhibits electric field, said electric field ranging from $10^{-6}$ V/m to 1 V/m.

16. The power source of claim 9, wherein said electrical conductivity ranges from $10^3 \Omega^{-1} \cdot m^{-1}$ to $10^8 \Omega^{-1} \cdot m^{-1}$.

17. A structure exhibiting an electret,
said electret comprising electret material,
said electret material exhibiting substantial electrical conductivity,
said electret material comprising mobile charge carriers,
said carriers exhibiting concentration,
said concentration exhibiting gradient,
said gradient being along a line in said electret material,
said electret material also comprising electric dipole,
said dipole being created by said carriers,
said dipole consisting of positive charge center and negative charge center,
said line consisting of a trace from said positive charge center to said negative charge center,
said trace being along the path of least electrical resistance,
said electret material being electrically continuous along said trace,
said electret material also comprising microstructure,
said microstructure comprising a plurality of microscopic features,
said plurality of microscopic features being positioned along said trace,
said plurality of microscopic features interacting with said carriers,
said interaction enhancing said dipole.

18. The structure of claim 17, wherein said electret material is selected from the group consisting of metals, alloys, copper, nickel, steel, stainless steel, alloy steels, galvanized steel, tin, tin-lead, metal-matrix composites, carbons, carbon fibers, exfoliated-graphite-based flexible graphite, carbon nanotubes, carbon nanofibers, graphite, graphene, isotropic graphite, carbon-carbon composites, ceramic-matrix composites, cement-matrix composites, polymer-matrix composites, and carbon-matrix composites.

19. The structure of claim 17, wherein said plurality of microscopic features exhibit orientations, and said electret material exhibits a plurality of electrical characteristics,
said orientations comprising a plurality of orientations A,
said plurality of orientations A being at a plurality of non-zero angles relative to said trace,
said plurality of orientations A resulting in microstructural asymmetry along said trace,
said asymmetry being relative to the mid-point of said trace,
said plurality of electrical characteristics comprise electrical characteristic B,
said asymmetry resulting in substantial difference in said electrical characteristic B in the two opposite directions of said trace,
said difference enhancing said dipole.

20. The structure of claim 17, wherein said electret material comprises a plurality of grains,
said plurality of grains having crystallographic directions,
said directions comprising crystallographic direction C,
said crystallographic direction C being substantially parallel to said trace.

* * * * *